United States Patent
Wu

(10) Patent No.: US 8,495,896 B2
(45) Date of Patent: Jul. 30, 2013

(54) PROCESS, APPARATUS, AND MATERIAL FOR MAKING SILICON GERMANUIM CORE FIBER

(76) Inventor: Dau Wu, Fallbrook, CA (US)

( * ) Notice: Subject to any disclaimer, the term of this patent is extended or adjusted under 35 U.S.C. 154(b) by 89 days.

(21) Appl. No.: 13/168,303

(22) Filed: Jun. 24, 2011

(65) Prior Publication Data

US 2011/0256251 A1    Oct. 20, 2011

Related U.S. Application Data

(62) Division of application No. 12/501,183, filed on Jul. 10, 2009, now Pat. No. 8,065,893.

(51) Int. Cl.
*F27B 9/36* (2006.01)
*C03B 5/02* (2006.01)
*C03B 5/235* (2006.01)

(52) U.S. Cl.
USPC .......................... 65/509; 219/121.86

(58) Field of Classification Search
USPC .......................... 65/509; 219/121.86
See application file for complete search history.

(56) References Cited

U.S. PATENT DOCUMENTS

| | | | |
|---|---|---|---|
| 3,737,292 A | | 6/1973 | Shultz et al. |
| 3,957,474 A | * | 5/1976 | Kobayashi et al. ............. 65/392 |
| 4,062,665 A | | 12/1977 | Izawa et al. |
| 4,217,027 A | | 8/1980 | MacChesney et al. |
| 4,227,907 A | * | 10/1980 | Merritt ............................ 65/392 |
| 4,741,747 A | | 5/1988 | Geittner et al. |
| 4,820,322 A | | 4/1989 | Baumgart et al. |
| 5,443,610 A | * | 8/1995 | Urruti ............................ 65/486 |
| 6,200,258 B1 | | 3/2001 | Slater et al. |
| 6,220,060 B1 | | 4/2001 | Wisk et al. |
| 6,885,787 B2 | | 4/2005 | Antos et al. |
| 7,752,869 B2 | | 7/2010 | Otosaka et al. |
| 7,921,675 B2 | | 4/2011 | Bookbinder et al. |
| 2005/0022562 A1 | | 2/2005 | Allan et al. |
| 2005/0109066 A1 | | 5/2005 | Dabby et al. |
| 2005/0188728 A1 | * | 9/2005 | Zhiou ............................. 65/402 |
| 2008/0142828 A1 | | 6/2008 | Yang |
| 2011/0103756 A1 | * | 5/2011 | Rice et al. ..................... 385/123 |

FOREIGN PATENT DOCUMENTS

JP          60-112637       *   6/1985

OTHER PUBLICATIONS

J. Ballato et al "Silicon optical fiber" Opt. Express vol. 16, p. 18675 (2008).
J. Ballato et al "Glass-clad single-crystal germanium optical fiber" Opt. Express vol. 17, p. 8029 (2009).
J. Ballato et al "On the Fabrication of All-Glass Optical Fibers from Crystals" J. Appl. Phys. vol. 105, p. 053110 (2009).
B. Scott, el al "Fabrication of silicon optical fiber" Opt. Eng. vol. 48, p. 100501 (2009).
N. Healy et al "Large mode area silicon microstructured fiber with robust dual mode guidance" Opt. Express vol. 17, p. 18076 (2009).

(Continued)

*Primary Examiner* — Evan Pert
(74) *Attorney, Agent, or Firm* — Vista IP Law Group, LLP

(57) ABSTRACT

A process and apparatus for making silicon or silicon/germanium core fiber is described, which uses a plasma process with reducing agent to make preform. The process also makes the recommendations in selecting the adequate cladding tube for better fiber properties. An improved fiber drawing apparatus is also disclosed in order to draw this new type of preforms.

7 Claims, 5 Drawing Sheets

OTHER PUBLICATIONS

Ivan Temnykh et al "Optical multistability in a silicon-core silica-cladding fiber" Opt. Express vol. 18, p. 5305 (2010).
N. Healy et al "Tapered silicon optical fibers" vol. 18, p. 7594 (2010).
P. Mehta et al "Nonlinear transmission properties of hydrogenated amorphous silicon core optical fibers" vol. 18, p. 16826 (2010).
L. Lagonigro et al "Low loss silicon fibers for photonics applications" Appl. Phys. Lett. vol. 96, p. 41105 (2010).
Mehta, Petal "Mid-infrared transmission properties of amorphous germanium optical fibers" Appl. Phys. Lett. vol. 97, p. 71117 (2010).

* cited by examiner

PROCESS, APPARATUS, AND MATERIAL FOR MAKING SILICON GERMANUIM CORE FIBER

CROSS-REFERENCE TO RELATED APPLICATION

The present Application constitutes a divisional application of U.S. application Ser. No. 12/501,183 filed on Jul. 10, 2009 and entitled "PROCESS, APPARATUS, AND MATERIAL FOR MAKING SILICON GERMANIUM CORE FIBER." The contents of this application are hereby incorporated by reference in its entirety.

BACKGROUND

Optical fibers have been used in telecommunication and medical applications for many years. The materials commonly used for making these fibers are glass or quartz; that is silica ($SiO_2$). The silica core optical fiber has been used in telecommunication industry as transmission medium and medical field as light guide. However because of the limitation of the material property, silica core fiber can only transmit light up to 1.6 μm which may limit many of its applications in the biomedical and sensor fields.

There are generally two methods to make optical fibers. The rod-in-tube method is implemented by sleeving a glass rod inside glass tube, and then drawn them into fiber. The other method is a two step process of first making a preform and then drawing the preform into fiber. The second method is widely used in the industry because it allows the designer to custom make the desired properties of the produced product while also making a better quality fiber.

There are four process techniques generally being used for making silica core preforms: Outside Vapor Deposition (OVD) developed at Coring, taught in U.S. Pat. No. 3,737,292 and others; Vapor Axial Deposition (VAD) developed at NTT Laboratories, Japan and used by the major Japanese producers taught in U.S. Pat. No. 4,062,665 and others; Modified Chemical Vapor Deposition (MCVD) developed at AT&T Bell Laboratories and taught in U.S. Pat. No. 4,217,027 and others; as well as the Plasma Chemical Vapor Deposition (PCVD) developed at Philips Research Laboratories, Germany and taught in U.S. Pat. Re 30,635 and U.S. Pat. No. 4,741,747.

The OVD and VAD methods are very similar to each other. The difference is that OVD has the deposition target placed horizontally and VAD has the target in vertical position and moving upward during the process. The deposition target of both processes do not become part of the finished product and there may not be a limitation on the size of finished product. This allows these two processes to be very efficient manufacturing processes. However, these processes are very complicated and capital investments requirements are very high. In addition, both processes use hydrogen and oxygen torch as the energy source, which requires additional drying steps in making conventional optical fibers.

The MCVD and PCVD methods use tubes as a substrate to deposit new layers onto the inner wall of the substrate tube, where that tube becomes part of the finished product. The tube provides a clean and isolated environment for the new deposited materials, but it also limits the size of the preform can be made. The capital investments are much lower than OVD and VAD processes, and the processes are less complicated. MCVD method also uses hydrogen and oxygen torch as the energy source; the PCVD method uses microwave as its energy source, it allows wilder deposition temperature range and has higher material utilization rate.

SUMMARY OF THE INVENTION

In some embodiments of the invention, silicon or silicon germanium core fiber is manufactured by performing preform fabrication using a plasma process with a reducing agent, such as hydrogen or a mixture of argon and hydrogen. Fiber drawing is then performed with a furnace and a laser if needed.

According to some embodiments, the object of this invention is to identify a suitable preform fabrication technique, and modify that silica core preform fabrication process in order to make the silicon/germanium core fiber.

Another object is to select the cladding tubes based on the physical properties of the material to minimize the processing problem and also improve the quality and performance of the silicon/germanium core fiber.

Yet another object is to design a new fiber drawing furnace such that it can draw the new type of silicon/germanium core fiber.

BRIEF DESCRIPTION OF THE DRAWINGS

The present invention is described in detail below with reference to the attached drawing figures, which are incorporated by reference herein and wherein.

DETAILED DESCRIPTION OF THE INVENTION

Figure 1:
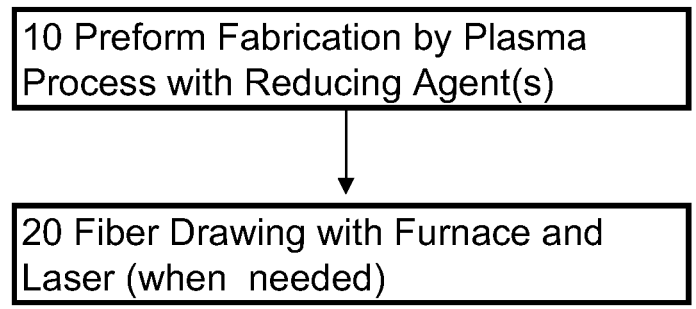
FIG. 1 shows the overall processing steps in make silicon/germanium core fiber.

Examples of embodiments of the invention are described, referencing the attached figures and diagrams that provide persons skilled in the art pertaining to the design and manufacturing of optical fiber with the information required to practice the claimed apparatuses and methods. The use of specific examples is solely to assist in understanding the described and claimed apparatuses and methods. Persons skilled in the art; however, will readily identify further variations, examples, and alternate hardware implementations and arrangements that are within the scope of the appended claims.

As previously noted, the materials commonly used for making fibers include glass or quartz, but silica core fibers have disadvantageous material properties, where they can only transmit light up to 1.6 μm which may limit many of its applications in the biomedical and sensor fields.

As alternative, either Silicon or Germanium may be used a materials for making fibers. Silicon (Si) has high transmittance between 1.2 to 8.0 μm and Germanium (Ge) with high transmittance between 2.0 to 17.0 μm. Therefore, these are good alternatives to silica for the transmitting light energy in the infrared region. Although there are other materials can transmit light in the same infrared region, the availability, toxicity and complexity in fabrication make these materials expensive and less attractive.

Silicon and germanium also have much higher Raman coefficients than doped quartz glass, which makes them ideal mediums for nonlinear optical applications. Non linear optical materials are playing important roles in the transformation of information storage and transmission from electrical to optical domain. Silicon and germanium have been widely used in the electronic industry that makes them the ideal candidates for this application. In addition, silicon and germanium are isomorphous and mutually soluble in all proportions; which allow them to mix in any ratio and achieve desired properties, for example fibers have different index of refraction profiles.

There are many fabrication techniques in making silicon or silicon/germanium ingots and devices (chips), with many of them well established processes with years of operation experiences. But these processes emphasize the electrical properties of the materials, such as resistance, carrier life time and etc. The problem is that these processes do not focus on the optical properties of the materials and hence may result in optical-related issues in the manufactured products.

In addition, semiconductor chips will generate heat during its operation, but when the device is operating at higher speed, more heat will be generated. Therefore, when silicon or silicon/germanium is making contact with other materials, the thermal conductivity of the materials needs to be properly addressed. However, because most of the devices are operated near the room temperature and the bonding process does not subject to very high temperature; the matching of the thermal expansion between silicon or silicon/germanium with the substrate is a less of a concern.

Unlike the semiconductor devices, fibers guide the light (photons) but not conduct the electricity (electrons). In order to guide the light, fiber should have two components: a core with higher index of refraction and a clad with lower index of refraction. The light will be reflected at core and clad boundary and the light can be guided by the fiber. Usually the cladding layer of a fiber is made of quartz or glass. The quartz or glass can stand compression stress very well, but it breaks very easily under tension. Thus the core and clad must be selected properly based on their thermal expansion coefficients. If they are not properly matched, the core will have a higher thermal expansion coefficient than the clad.

Semiconductor device is built layer by layer in plane from; the fiber is in a continuous cylindrical form. With these said unique requirements of the fiber, it is impossible to use the conventional ingot or device fabrication methods to make silicon or silicon/germanium core fiber.

As noted above, there are generally four process techniques being used for making silica core preforms, including OVD, VAD, MCVD, and PCVD. However, the OVD and VAD methods are very complicated and capital investments requirements are very high. In addition, both processes use hydrogen and oxygen torch as the energy source, which requires additional drying steps in making conventional optical fibers. For at least these reasons, that makes both processes unsuitable for making silicon or silicon core preform.

The MCVD and PCVD methods correspond to capital investments that are much lower than OVD and VAD processes, and the processes are less complicated. MCVD method also uses hydrogen and oxygen torch as the energy source, while the PCVD method uses microwave as its energy source, which allows wilder deposition temperature range and has higher material utilization rate. Therefore, with some modification the PCVD method is a better choice as the process method for making silicon or silicon/germanium core preform.

An article published in Optical Express Vol 16 No. 23 page 18675 (2008) with the title "Silicon Optical Fiber" by J Battato et al., describes an approach for utilizing conventional rod-in-tube technique for manufacturing optical fibers by sleeving a silicon rod inside quartz tubes, and then draw into fiber. However, this approach is disadvantageous because it results in fiber with lower quality and with sub-optimal performance.

The present invention provides a method and apparatus for manufacturing silicon or silicon germanium core fiber. According to some embodiments, the fiber is manufactured by performing preform fabrication using a plasma process with a reducing agent, such as hydrogen or a mixture of argon and hydrogen. Fiber drawing is then performed with a furnace and a laser if needed.

FIG. 1 illustrates a process of making silicon/germanium core fiber according to some embodiments of the invention. At step 10, preform fabrication is performed with a plasma process using a reducing agent. The plasma processing may be performed using a plasma chemical vapor deposition apparatus with reaction chemicals to react with the reducing agent. Examples of suitable reducing agents include Hydrogen and a mixture of Argon and Hydrogen. At step 20, the preform is drawn into a fiber. Either, or both, a furnace and laser may be used to draw the preform into fiber.

Any suitable preform fabrication system or plasma generator may be employed with embodiments of the invention. For example, complete preform fabrication systems are commercially available from the suppliers as Nextrom (USA) INC., Heathway Products Division of the N.M. Knight Company Inc SG Controls Ltd and others. Plasma generators are commercially available from suppliers such as General Plasma Inc.

Figure 2:
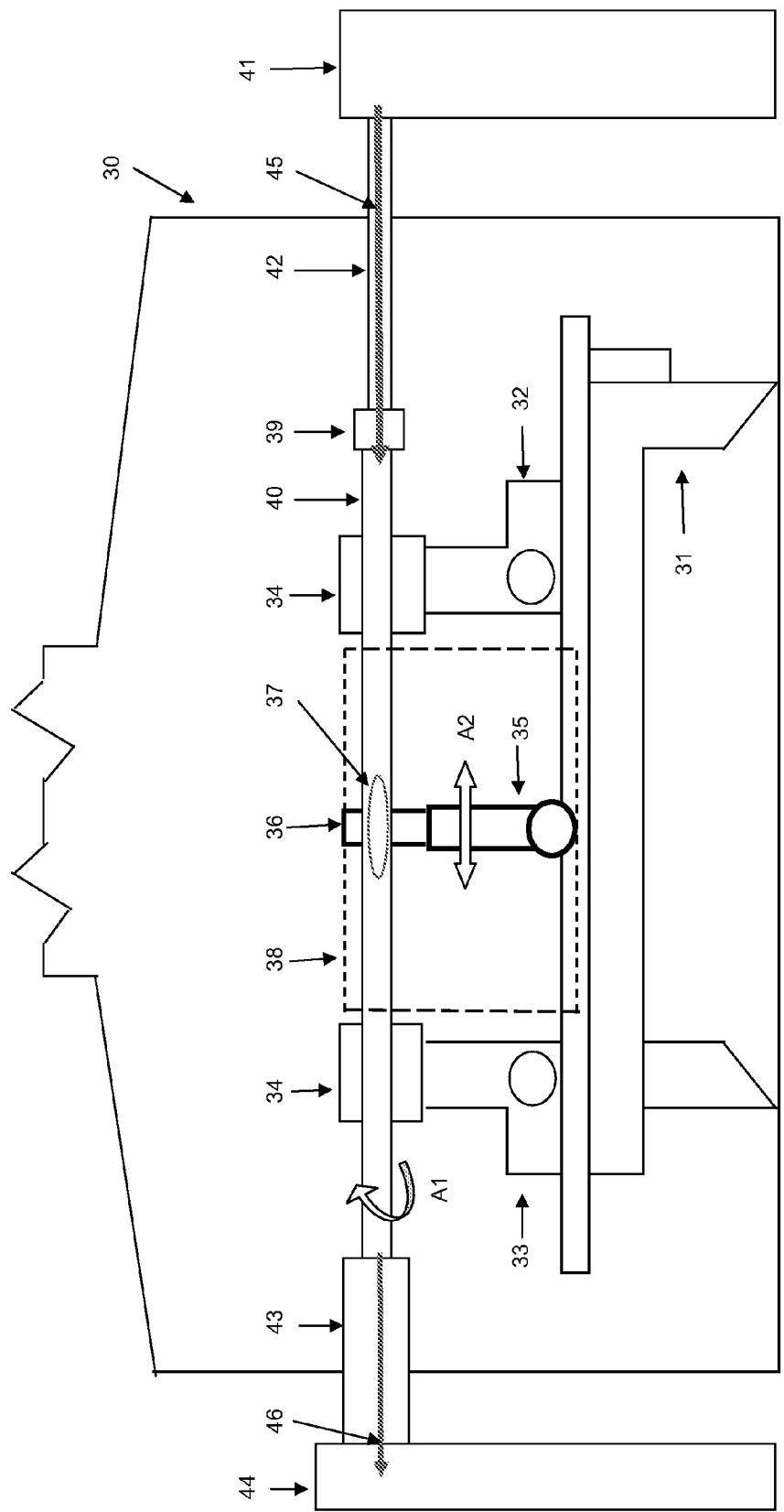
FIG. 2 shows the basic apparatuses used for making preform.

FIG. 2 shows an example of a preform fabrication apparatus to be used with a plasma process according to an embodiment of the present invention. The apparatus comprises a hood 30 which is sealed to prevent impurities from being introduced into the final product, to prevent the possibility leakage of microwave radiation from the microwave source, and to provide necessary heat and chemical exhaust from the process.

Within the hood 30 is a lathe 31. The lathe 31 has a headstock 32 and a tailstock 33. The headstock 32 and the tailstock 33 are provided with a pair of opposing rotating spindle chucks 34, which hold a substrate tube 40. The spindle chucks 34 can rotate the tube 40, in a clockwise or counterclockwise rotation as indicated by arrow A1. A movable carriage 35 is mounted to the lathe 31 and can travel in either direction on the lathe, as indicated by double headed arrow A2.

A plasma source microwave magnetron 36 can generate plasma fire ball 37 inside the tube 40 and it is supported by carriage 35. Carriage 35 thus moves magnetron 36 along the length of the tube 40. To maintain the desired deposition temperature inside the tube 40, the magnetron 36 and carriage 35 are housed inside a furnace oven 38

During the deposition process, the spindle chucks 34 can rotate the tube 40 to improve the uniformity of the deposition. However, in some embodiments, this rotation is not absolutely necessary. In the preferred embodiment, the magnetron 36 positioned on the carriage 35 moves in both directions along a substantial portion of the tube 40. This allows the magnetron 36 to travel along that portion of the tube 40 and deposit materials.

Instead of moving the magnetron 36 along the length of the tube, the tube 40, may be moved while the magnetron 36 remains stationary. This can be realized by having the headstock 32 and the tailstock 33 of the lathe move the tube in a reciprocating fashion so that all relevant portions of the tube are brought directly above the magnetron 36.

The plasma forming gases and reaction chemicals are controlled and supplied from the chemical supply system 41 through the feeding line 42. A coupling device with valve, 39 is used to connect the feeding line 42 and tube 40. The injecting flow path 45 is shown. The byproducts and undeposited materials will be removed by pump system 44 through exhaust pipe 43. The exhaust flow path 46 is also shown. The pump system 44 is also used to maintain the desired pressure inside the tube 40; typically the inside pressure is about 100 to 200 Ton lower than atmospheric pressure.

The processing steps utilize plasma fire ball forming gases that comprise Argon and Hydrogen, versus the Oxygen or Oxygen mixed with Nitrogen that may be suitable for making silica core preform. The hydrogen has very high thermal conductivity and heat capacity; it is impossible to form a plasma fire ball by itself. The Argon has much lower activity energy requirement, and it has much higher temperature. When Hydrogen and Argon are properly mixed, the required plasma fire ball can be formed. However, the fire ball temperature and power requirement are different from the Oxygen or Air plasma.

The chemicals used for making the silicon core preforms according to the present embodiment are quite different from those for making silica. Hydrogen or its compounds cannot be used in making silica core preforms because water could form and could become a major impurity which can degrade the fiber property. Oxygen is not allowed in making silicon, because silica will change the desire property of the silicon. Besides, with the presence of the Oxygen it always will produce silica instead of silicon.

For example: in making silica the following chemicals are used and reaction takes place:

$$SiCl_4 + O_2 \rightarrow SiO_2 + 2Cl_2 \quad (1)$$

For making silicon, the following chemicals can be used and reactions take place:

$$SiCl_4 + 2H_2 \rightarrow Si + 4HCl \quad (2)$$

$$SiHCl_3 + H_2 \rightarrow Si + 3HCl \quad (3)$$

$$SiH_4 \rightarrow Si + 2H_2 \quad (4)$$

Chemical reactions and reaction mechanisms are completely different for the two; the conventional silica core preform fabrication process is an oxidation reaction and is an exothermic reaction. The silicon/germanium core preform is a reduction reaction and is an endothermic reaction.

Furthermore, there are significant differences in physical properties of Silica (SiO2), Silicon (Si), and Germanium (Ge); as well as the availability of different types of substrate tube. For better comparison, the following table provides a summary of the important physical properties:

TABLE 1

Physical Properties Of Silica (SiO2) Silicon (Si) Germanium (Ge) And Different Types Of Tube

| Material | Temperature (° C.) Melting | Temperature (° C.) Softening | Thermal Expansion Coefficient ($10^{-7}$ cm/cm/° C.) | Index of Refraction | Transmittance (>90%) (μm) |
|---|---|---|---|---|---|
| Silica (SiO2) | 1713 | 1680 | 5.5 | 1.458 | 0.2-2.5 |
| Quartz Tube (GE 214) | | 1683 | 5.5 | 1.459 | 0.2-2.5 |
| Silicon (Si) | 1410 | | 30.0 | 4.01 | 1.2-8.0 |
| Germanium (Ge) | 937 | | 61.0 | 5.71 | 2.0-17.0 |
| Vycor Tube (Corning 7913) | | 1530 | 7.5 | 1.458 | 0.4-2.5 |
| AMLCD Tube Corning 1737 | | 975 | 37.6 | 1.580 | 0.5-2.5 |

From Table 1, it is very clear that silica and quartz have very similar properties; these are the reasons the fiber optics industry has successfully manufactured good quality products. Silicon or germanium do not have wide phase transition temperature (from solid to liquid) as silica does, and therefore there is no softening temperature for silicon or germanium. From the same table, it also clear that using a Vycor (Coring 7913) tube instead of a Quartz tube such as GE214 will produce a better match in physical properties between silicon and tube. Because it has much smaller temperature differences (melting temperature of Si and tube softening temperatures) and better match in Thermal Expansion Coefficient, this will result in less processing problem and better products. According to some embodiments, when making the Silicon/Germanium core preform, the AMLCD (Corning 1737) tube will be a better choice. The selection of these two tubes are just examples showing how to select a more suitable tube for making Silicon or Silicon/Germanium core preforms. Persons skilled in the art can find other tubes that are suitable for the same application.

Figure 3:
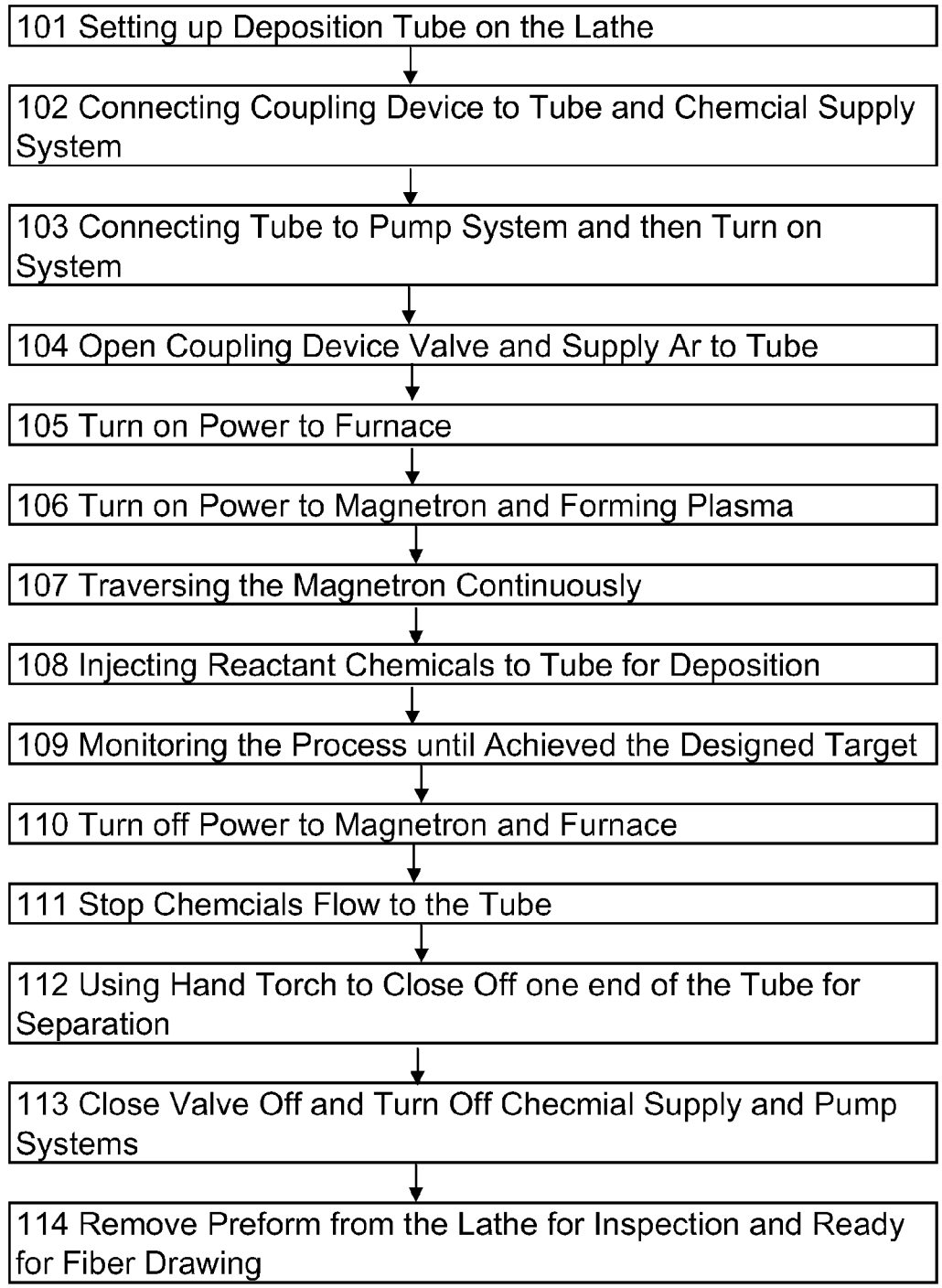
FIG. 3 shows the detailed processing steps in make the preforms that can be drawn into silicon/germanium core fiber.

FIG. 3 describes the detailed processing steps in making the preform. The process starts with Step 101, with the mounting of the deposition tube 40 on a glass working lathe 31, and ensuring the tube is rotating true to the center of the axis of the lathe. Step 102 is performed to connect the coupling device 39 with valve closed, to tube 40 and feeding line 42. Step 103 is performed to connect the tube 40 to the exhaust pipe 43 and pump system 44 and then turn on the pump system. Step 104 is performed to open the valve on coupling device 39 and flow Argon (Ar) gas thru tube 40.

Step 105 turns on the power to furnace 38. The temperature of the furnace can be in the range between at or approximately 500 to 1100° C., depending on the substrate tube, deposited material and design. The preferred temperature range is between at or approximately 900 to 1000° C. The lower the temperature, the more gases components (H2 and/or Cl2) will be trapped in the deposited layers and that can change the characteristic of the deposited material.

When the furnace reaches the designed temperature, Step 106 will turn the power on to magnetron 36 and form the plasma fire ball, first with Ar gas only, then feeding in Hydrogen (H2) gas to form the Ar/H2 plasma by adjusting the power to the magnetron 36 and the flow rate of these two gases. The flow rate and plasma power will depend on the size of deposition tube as well as the reaction chemicals being used. However the ratio between the Ar and H2 is typically maintained as at or approximately 80/20 to 70/30. Step 107 will traverse the carriage 35 to move the magnetron 36 alone the tube and move the plasma fire ball inside the tube. The carriage 35 is traversed back and forth for a few cycles to ensure the proper operation of the magnetron and the formation of plasma fire ball.

Step 108 injects reaction chemicals into the inside of the tube and begins the deposition. The feed-in reaction chemicals can be any silicon bearing compounds without oxygen, for example, Silane (SiH4) with Hydrogen (H2), or Silicon Tetrachloride (SiCl4) with Hydrogen (H2), or Trichlorosilane (SiHCl3) with Hydrogen (H2), and other Chlorosilanes with hydrogen for silicon core fiber. Adding germanium to silicon can form an alloy of silicon and germanium (Si/Ge). This can extend the transition to far infrared region and further enhance the non-linear optical process. It can also change the band gap of this semiconductor material with its unique optoelectronic properties. For Silicon/Germanium core fiber, additional germanium bearing compounds without oxygen, for example Germane (GeH4) or Germanium Tetrachloride (GeC14) can be added to the feed-in line. Because of the unique natural of Silicon and Germanium, they can be mixed in any ratio. Therefore, depending on the design any mixing ratio of these chemicals can be used. For example, in a step-index profile design, the germanium to silicon concentration ratio is held constant for all deposited layers. For a graded-index profile design, the germanium to silicon concentration ratio is gradually changed as the layers are being deposited.

Step 109 continues monitoring the deposition process until it reaches the designed deposition thickness. In Step 110, the power is turned off to the magnetron 36 and furnace 38. Step 111 turns off the supply of chemicals and H2 gas to the tube, but maintains the Ar gas flow.

In Step 112, the rotation is turned on for the spindle chucks 34 and a hand torch (not shown) is used to close off and separate the deposited tube at the exhaust end (close to tailstock 33) with reduced flow rate of Ar gas. Step 113 closes off the valve on the coupling device, and then turns off the power to pump system and switches off the Argon gas flow from the chemical supply system 41. In Step 114, the process removes the deposited tube (preform) from the lathe 31. After inspection, the preform is ready for fiber drawing.

If the core to cladding ratio is too large, a jacketing process can be adopted by sleeving another tube over the preform as taught in U.S. Pat. No. 4,820,322.

Figure 4:
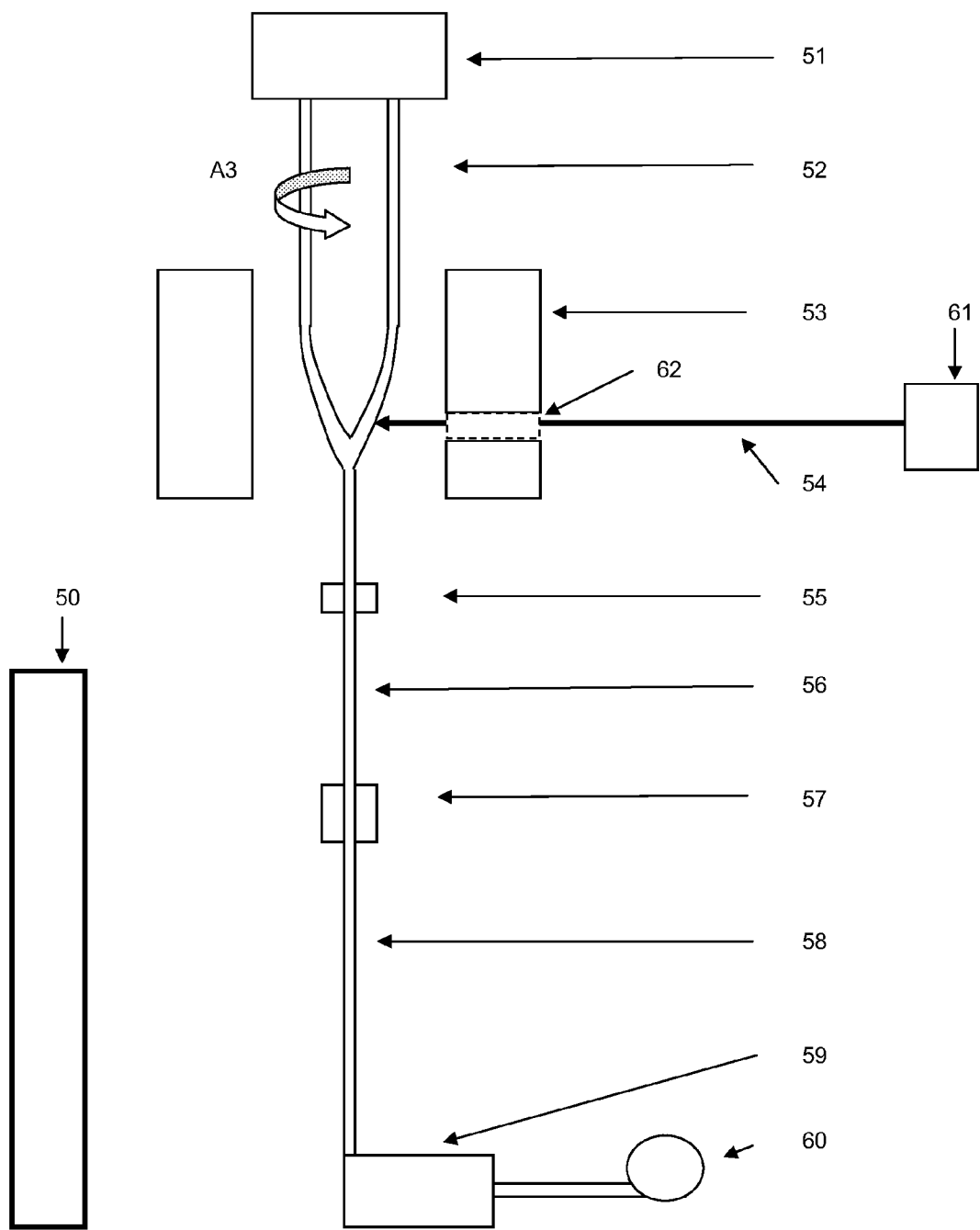
FIG. 4 shows the basic apparatuses used for drawing fiber.

FIG. 4 shows an example fiber drawing apparatuses with furnace and laser. The entire fiber drawing apparatus is housed inside a clean environment to prevent impurities from being introduced onto the surface of the fiber. All components are supported on a tower structure (not shown) and are controlled by a main control unit 50. At the top of the tower is the preform holding and feeding controller 51, which holds the preform 52, moves the preform in x-y direction for a centering position, moves the preform upwards and downwards in z-direction, rotates the preform along the center axis, as shown in arrow A3, and controls the pressure inside the preform. Typically the pressure is maintained about 10 to 20 Ton lower for inside the tube against the atmospheric pressure.

The furnace 53 is the main heat source which will soften the preform/tube and form a neckdown region where the tube will collapse and become thin solid strand of fiber. The furnace has a window 62 on the side allowing the laser beam 54 from a high power laser 61 to aim at the neckdown region of the preform. This window 62 can be made of sapphire or quartz. This additional laser beam is not required or always required for drawing silica fiber, or if the core material has a lower melting or softening temperature than the tube. The laser becomes more important and useful when the core has higher melting temperature than the tube; such as making silicon core or silicon/germanium core with AMLCD (Corning 1737) tubing for better matching of the thermal expansion coefficient. Under this condition the fiber drawing furnace will maintain at the temperature such that it will soften the tube. A high power laser 61 (such as an Argon laser or YAG laser) will be used to as additional heat source for melting of the core material. When using Argon laser operated in the visible region (e.g., between 454 nm and 529 nm) or YAG laser (at 1.06 µm or frequency doubling at 0.53 µm), the laser power will not be absorbed by the cladding tube but it will be absorbed by Si or Si/Ge and melt the core material. A preferred method is by introducing this laser light through a sapphire window on the side wall of the furnace to direct the light right above the neckdown region (as shown in FIG. 4). However, the laser light can also use a set of mirrors to direct the light to the target region from the bottom or the top of the furnace.

The fiber diameter gauge 55 measures the diameter of the fiber, and provides the measured information to a main controller 50, which then sends control signal to preform holding and controller 51 to change the feeding rate and control the diameter of bare fiber 56. To increase the fiber diameter, it increases the feeding (lowering) rate of the preform controller 51. Coating application unit 57 will apply protective coating on line to the bare fiber and becomes coated fiber 58. The unit consists of coating applicator, coating curing device, and coating diameter controller; depending on the design it can apply single or dual layers coating material. Fiber pulling controller 59 sets the fiber drawing speed, controls the rotation speed of fiber take-up drum/spool 60 and provides the feedback information to the main controller 50.

Any suitable fiber drawing system or laser system may be employed with embodiments of the invention. For example, complete fiber drawing systems are commercially available from the suppliers as Nextrom, Heathway, SG Controls Ltd and others. These companies also supply components that persons skilled in the art can build the fiber drawing system with their own design. Laser systems are commercially available from Newport Corporation-Spectra-Physics Lasers Division, Coherent, Inc and others.

Figure 5:
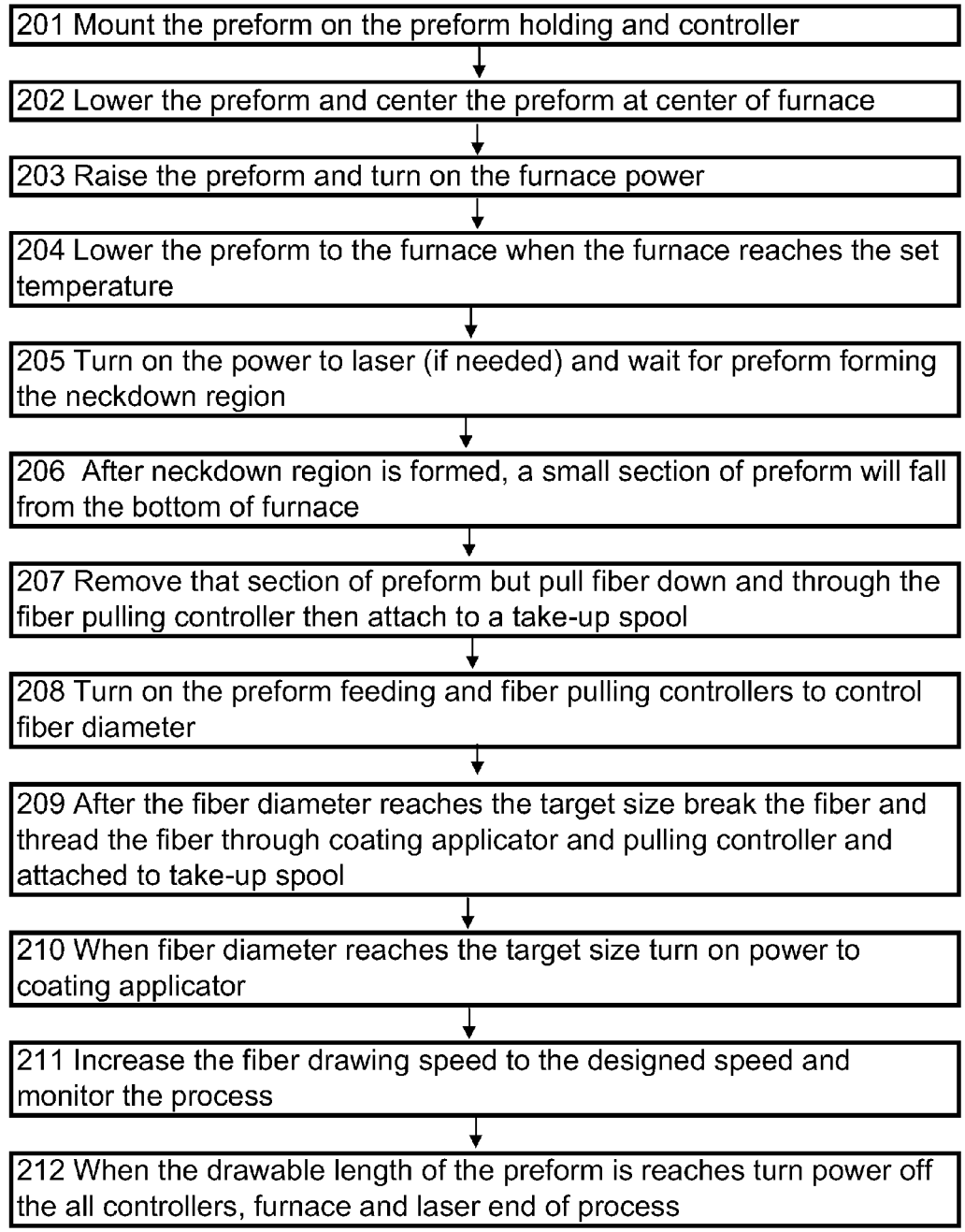
FIG. 5 shows the detailed processing step in drawing the preform into fiber.

FIG. 5 describes the detailed processing steps in drawing the fiber according to some embodiments of the invention. In Step 201 the preform will be mounted onto the preform holding and controller 51 at the top of the tower structure. It will also connect the coupling device to the pressure control device which is part of this controller. The valve on the coupling device will be open after the connection is made.

In Step 202 the preform will be lowered such that the bottom end of the preform will be inside the furnace. The position of the preform will be adjusted such that it will be at the center of the furnace opening.

After the preform is centered in Step 203 the preform will be raised and at the same time the power to the furnace will be turned on. When the furnace reaches the designed temperature in Step 204, the preform will be lowered and a small bottom section of it will be located at hottest point of furnace.

The pressure inside the preform tube will be maintained slightly lower than the atmospheric pressure. In Step 205 the process will wait for the preform to form the neckdown region; at the same time turn on the laser power if needed or desired.

In Step 206 after the neckdown is formed, a small section of preform will fall from the bottom of the furnace, on that section a continuous strand of fiber is attached. In Step 207 the process will cut off that small section of preform and feed the strand fiber through fiber pulling controller 59 and attach to a take-up spool 60. In Step 208, the main controller 50 will be used to control the controllers of preform feeding 51 and fiber pulling 59 and the measured results from the fiber diameter gauge 55 to control the fiber diameter. In Step 209, when the fiber reaches the designed diameter, the fiber strand will be broken and threaded through the coating applicator 57 and fiber pulling controller 59, and the fiber will be attached to a spool on the take-up drum/spool 60.

In Step 210, when the fiber reaches the target diameter, the process turns on the powers for supplying the coating material to the application, the curing device and coating diameter controller. In Step 211, the process replaces a new spool to the take-up drum/spool 60 and then increases the fiber drawing speed as it continues to monitor the process. In Step 212 when the drawable length of the preform is reached, the power will be turned off to the controllers. At this point, the Silicon or Silicon/Germanium Core fiber has been manufactured.

In the foregoing specification, the embodiments have been described with reference to specific elements thereof. It will, however, be evident that various modifications and changes may be made thereto without departing from the broader spirit and scope of the embodiments. For example, the reader is to understand that the specific ordering and combination of process actions shown in the process flow diagrams described herein are merely illustrative, and that using different or additional process actions, or a different combination or ordering of process actions can be used to enact the embodiments. The specification and drawings are, accordingly, to be regarded in an illustrative rather than restrictive sense.

The invention claimed is:

1. An apparatus for manufacturing semiconductor core fiber, comprising:
   a housing structure;
   a device to hold preform material;
   both a furnace and a laser to draw fiber from the preform material, wherein the laser operates in the visible region;
   a controller to control drawing of the fiber;
   a mechanism to pull the fiber; and
   a storage device to store the pulled fiber.

2. The apparatus of claim 1 in which the device holding the preform is capable of moving the preform upwards and downwards as well as rotating the preform.

3. The apparatus of claim 1 in which the furnace is capable of maintaining a temperature which softens a cladding material of the preform.

4. The apparatus of claim 1 in which the laser is configured to assist in melting a core material while the preform is being drawn, wherein the core material has a higher melting temperature than a cladding material.

5. The apparatus of claim 1 further comprising a set of mirrors or a window made of quartz or sapphire for which to guide energy from the laser.

6. The apparatus of claim 1 in which the laser is configured so that energy from the laser is absorbed by a core material and transmitted through a cladding material.

7. The apparatus of claim 1 in which pressure inside the preform can be maintained at a range of 10 to 20 Torr lower than the atmospheric pressure while the preform is being drawn.

* * * * *